(12) United States Patent
Lee (10) Patent No.: US 9,376,743 B2
(45) Date of Patent: Jun. 28, 2016

(54) METHOD OF MANUFACTURING MASK FOR DEPOSITION

(71) Applicant: SAMSUNG DISPLAY CO., LTD., Yongin, Gyeonggi-Do (KR)

(72) Inventor: Sang-Yun Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 297 days.

(21) Appl. No.: 14/017,356

(22) Filed: Sep. 4, 2013

(65) Prior Publication Data

US 2014/0230219 A1   Aug. 21, 2014

(30) Foreign Application Priority Data

Feb. 20, 2013 (KR) .......................... 10-2013-0018206

(51) Int. Cl.
*C23C 14/04* (2006.01)

(52) U.S. Cl.
CPC ......... *C23C 14/042* (2013.01); *Y10T 29/49826* (2015.01)

(58) Field of Classification Search
CPC .. Y10T 29/49826; C23C 14/042; B05B 15/04
See application file for complete search history.

(56) References Cited

U.S. PATENT DOCUMENTS

| 2009/0137180 | A1* | 5/2009 | Sung | ..................... C23C 14/042 445/60 |
| 2009/0297768 | A1* | 12/2009 | Ko | ......................... B23K 31/02 428/136 |

FOREIGN PATENT DOCUMENTS

| KR | 10-0741138 B1 | 7/2007 |
| KR | 100741138 | * 7/2007 |
| KR | 10-2006-0127247 | 12/2008 |
| KR | 10-2009-0011270 | 2/2009 |
| KR | 10-2009-0053418 A | 5/2009 |

* cited by examiner

*Primary Examiner* — Sarang Afzali
*Assistant Examiner* — Ruth G Hidlago-Hernande
(74) *Attorney, Agent, or Firm* — Lee & Morse, P.C.

(57) ABSTRACT

A method of manufacturing a deposition mask includes providing a frame including a pair of first supports and a pair of second supports surrounding an opening, each of the first supports including a contact face corresponding to a face of the first support and including a fastening recess at an outer edge of the first support, inserting an insertion block corresponding in shape to the fastening recess into the fastening recess, bonding opposing ends of a mask strip having an opening pattern to the contact faces while stretching the mask strip, and removing the insertion block from the fastening recess.

13 Claims, 8 Drawing Sheets

METHOD OF MANUFACTURING MASK FOR DEPOSITION

CROSS-REFERENCE TO RELATED APPLICATION

This application claims priority to and the benefit of Korean Patent Application No. 10-2013-0018206, filed in the Korean Intellectual Property Office on Feb. 20, 2013, the entire contents of which are incorporated herein by reference.

BACKGROUND

1. Field

Embodiments relate to a method of manufacturing a mask for deposition.

2. Description of the Related Art

An organic light emitting diode (OLED) display may include a hole injection electrode, an electron injection electrode, and an organic emission layer formed between the hole injection electrode and the electron injection electrode, and is a self-emissive display device that emits light according to recombination and extinction of holes injected from an anode and electrons injected from a cathode and extinction of recombined holes and elements in the organic emission layer. OLED displays are a focus of attention as a next-generation display of mobile electronic devices because of high quality characteristics thereof such as low power consumption, high luminance, wide viewing angle and high response speed.

The OLED display may include an organic light-emitting display panel having a display substrate on which a thin film transistor and an organic light emitting element (OLED) are formed. The OLED includes an anode, a cathode and an organic emission layer and emits light according to transition of excitons generated from holes and electrons respectively injected from the anode and the cathode to the ground state.

The above information disclosed in this Background section is only for enhancement of understanding of the background of the art and therefore it may contain information that does not form the prior art that is already known in this country to a person of ordinary skill in the art.

SUMMARY

Embodiments are directed to a method of manufacturing a deposition mask, the method including providing a frame including a pair of first supports and a pair of second supports surrounding an opening, each of the first supports including a contact face corresponding to a face of the first support and including a fastening recess at an outer edge of the first support, inserting an insertion block corresponding in shape to the fastening recess into the fastening recess, bonding opposing ends of a mask strip having an opening pattern to the contact faces while stretching the mask strip, and removing the insertion block from the fastening recess.

The insertion block inserted into the fastening recess may have a same height as the contact face.

The first supports may include a plurality of fastening recesses, the fastening recesses being disposed at a predetermined interval along the first supports, and an insertion block may be inserted into each fastening recess.

The mask strip may include a strip main body and clamping parts, the strip main body having an opening pattern, the clamping parts extending from opposing ends of the strip main body in an elongation direction of the strip main body, and the bonding of the mask strip may include bonding the opposing ends of the strip main body to the contact face while gripping the clamping parts to stretch the mask strip.

The method may further include removing the clamping parts from the mask strip after bonding the mask strip.

The inserting, the bonding, and the removing may be performed sequentially in the stated order.

Embodiments are also directed to a method of manufacturing a deposition mask, the method including providing a frame including a pair of first supports and a pair of second supports surrounding an opening, each of the first supports including a contact face corresponding to a face of the first support, a stepped face outside the contact face and having a height lower than the contact face, and a fastening recess at an outer edge of the first support, disposing an insertion block extending along the stepped face on the stepped face, bonding opposing ends of a mask strip having an opening pattern to the contact faces while stretching the mask strip, and removing the insertion block from the stepped face.

The insertion block may have a thickness corresponding to a height difference between the contact face and the stepped face.

The mask strip may include a strip main body and clamping parts, the strip main body having the opening pattern, the clamping parts extending from opposing ends of the strip main body in an elongation direction of the strip main body, and the bonding of the mask strip may include bonding the opposing ends of the strip main body to the contact face while gripping the clamping parts to stretch the mask strip.

The method may further include removing the clamping parts from the mask strip after bonding the mask strip.

The disposing, the bonding, and the removing may be performed sequentially in the stated order.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. Like reference numerals refer to like elements throughout.

In addition, unless explicitly described to the contrary, the word "comprise" and variations such as "comprises" or "comprising", will be understood to imply the inclusion of stated elements but not the exclusion of any other elements. It will be understood that when an element is referred to as being "on" another element, it may be on or beneath the other element.

Figure 1:
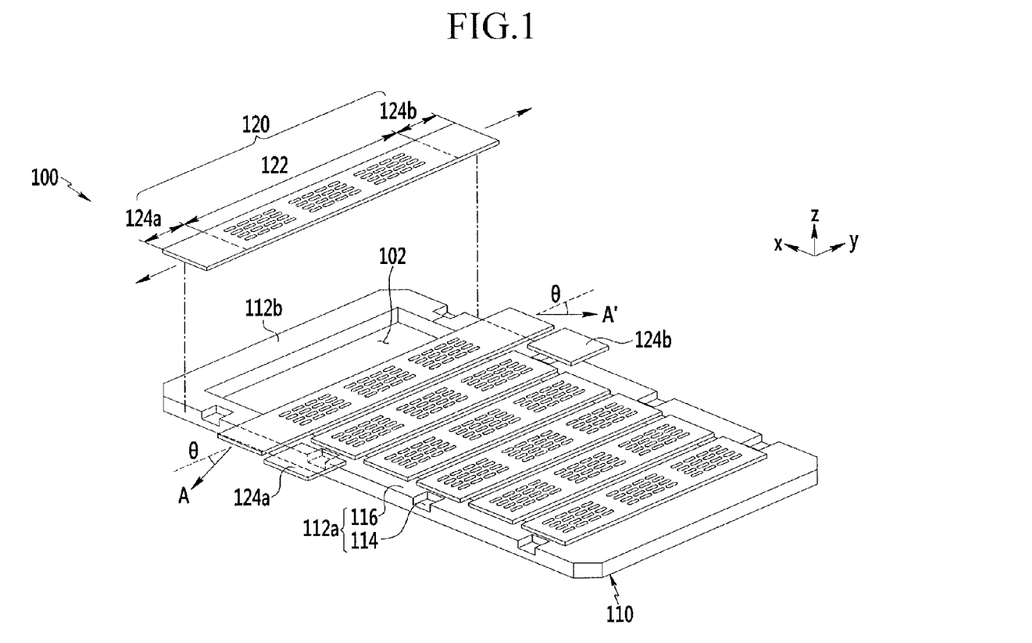
FIG. 1 is a perspective view of a deposition mask manufactured by a method of manufacturing a deposition mask according to a first example embodiment.
Figure 2A:
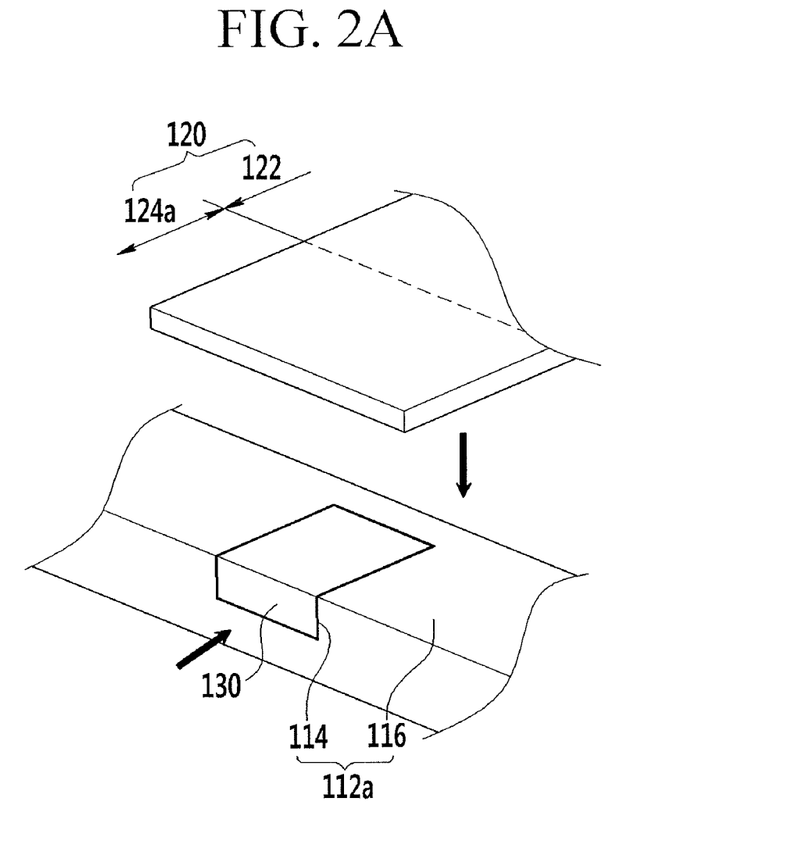
FIGS. 2A to 2C sequentially illustrate the method of manufacturing a deposition mask according to a first example embodiment.
Figure 2B:
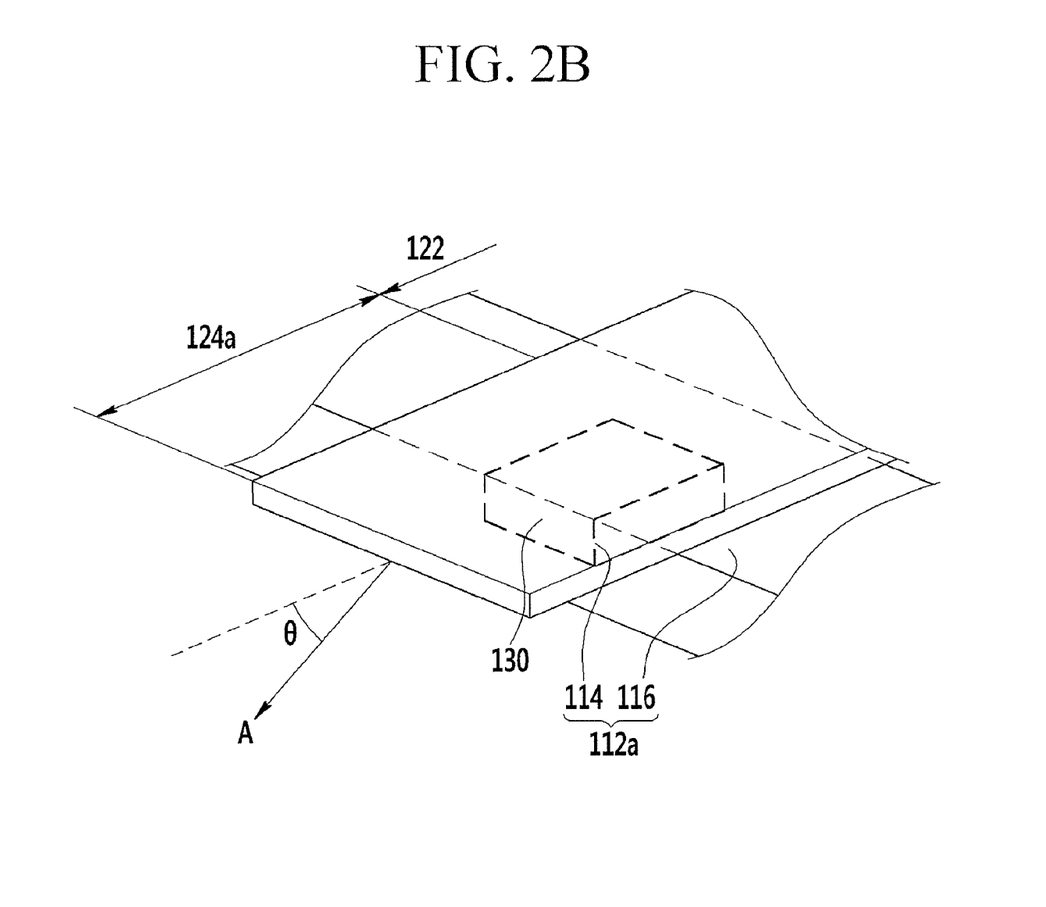
Figure 2C:
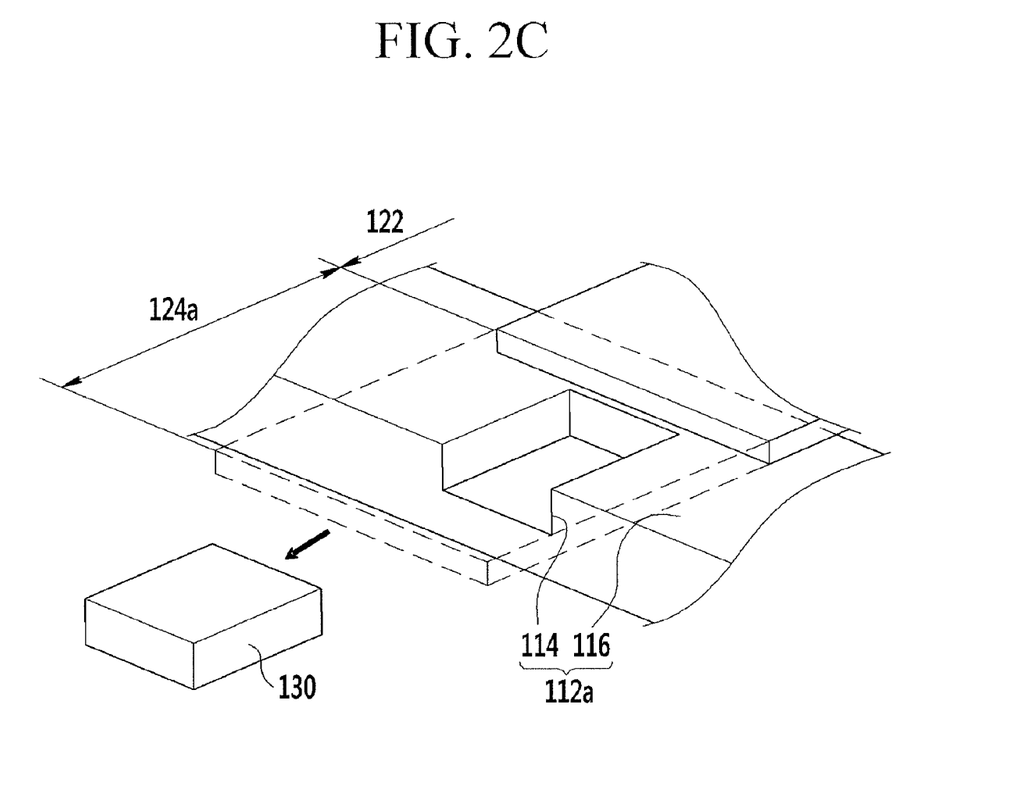

FIG. 1 is a perspective view of a deposition mask manufactured by a method of manufacturing a deposition mask according to a first example embodiment and FIGS. 2A to 2C sequentially illustrate the method of manufacturing a deposition mask according to the first example embodiment.

Referring to FIGS. 1 and 2A to 2C, a method of manufacturing a deposition mask 100 according to an example embodiment includes a frame preparation operation, an insertion block inserting operation, a mask strip bonding operation and an insertion block detaching operation.

In the example embodiment illustrated in FIGS. 1 and 2A to 2C, first, a frame 110 for fixing unit mask strips 120 is prepared. The frame 110 includes a pair of first supports 112a and a pair of the second supports 112b which surround an opening 102. The first supports 112a are disposed opposite to each other having the opening 102 therebetween in the elongation direction (y-axis direction) of the mask strips 120. The second supports 112b are formed in a direction perpendicular to the first supports 112a and disposed opposite to each other having the opening 102 therebetween in the width direction (x-axis direction) of the mask strips 120. The frame 110 has sufficient rigidity since the unit mask strips 120 are supported in a tensile state and may have any suitable structure that does not interfere when a substrate and the deposition mask come into contact with each other.

The first supports 112a and the second supports 112b may have the same length or different lengths. In the present example embodiment, the first supports 112a are longer than the second supports 112b such that the first supports 112a form long sides of the frame 110 and the second supports 112b form short sides of the frame 110. The first supports 112a and the second supports 112b are connected to form the opening 102 in a rectangular shape.

The first supports 112a include a flat contact face 116 such that the mask strips 120 are bonded to the contact face 116. A fastening recess 114 is formed at the contact face 116 and a portion of the outer edge of the first supports 112a. The fastening recess 114 is formed at the contact face 116 in order to fix the deposition mask 100 to a mask fixing part when the deposition mask 100 is located in a deposition apparatus. The fastening recess 114 may be engraved in a rectangular shape. A plurality of fastening recesses 114 may be formed at a predetermined interval along the first supports 112a.

When the mask strip 120 is bonded to the frame 110, it is possible to stretch the mask strip 120 not only in the elongation direction (y-axis direction) of the mask strip 120 but also in a direction (A-A' direction) in which the mask strip 120 is lowered by a predetermined angle θ toward the frame 110 (z-axis direction), as shown in FIG. 1, to improve contact force between the mask strip 120 and the frame 110. Here, the mask strip 120 may be twisted since the mask strip 120 is not uniformly stretched due to the fastening recess 114 formed at the contact face 11.

To help prevent this, an insertion block 130 is inserted into the fastening recess 114, as shown in FIG. 2A. The insertion block 130 is formed in a shape corresponding to the fastening recess 114 and helps prevent the mask strip 120 from being twisted due to the fastening recess 114 when the mask strip 120 is stretched and bonded to the frame in a tensile state. The insertion block 130 preferably has the same height as the contact face 116 of the first supports 112a. The insertion block 130 may be formed in a rectangular shape corresponding to the fastening recess 114. When a plurality of fastening recesses 114 is formed, the insertion block 130 may be inserted into each fastening recess 114.

Referring to FIG. 2B, both ends of the mask strip 120 are bonded onto the contact face 116 while tension is applied to the mask strip 120.

The mask strip 120 is configured in the form of a thin plate elongated in one direction (y-axis direction), and a plurality of mask strips 120 is fixed to the frame 110 in parallel in the elongation direction thereof. The mask strip 120 is a member used to form an organic film pattern on a substrate and includes an opening pattern formed between blocking regions that block deposition of an organic material. An organic material is deposited on a substrate through the opening pattern of the mask strip 120. The mask strip 120 may be formed of a metal having elastic force and rigidity, such as nickel, a nickel alloy, a nickel-cobalt alloy, etc. However, the material of the mask strip 120 is not limited thereto and may be selected from various metals having elastic force and rigidity.

The mask strip 120 may include a strip main body 122 having an opening pattern and clamping parts 124a and 124b extended from both ends of the strip main body 122 in the elongation direction thereof. The clamping parts 124a and 124b are gripped when the mask strip 120 is stretched using a tensioner and may be removed by cutting after the mask strip 120 is bonded to the frame 110.

Opposing ends of the mask strip 120 are respectively bonded to the contact faces 116 of the first supports 112a. For example, both ends of the strip main body 122 are bonded to the contact faces 116. The fastening recess 114 is exposed when the clamping parts 124a and 124b are removed by bonding the strip main body 112 to the contact faces 116 such that the strip main body 112 is not superposed on the fastening recess 114.

It may be possible to prevent the mask strip 120 from being twisted according to the insertion block 130 inserted into the fastening recess 144 even when the mask strip 120 is stretched in a direction (A-A' direction) lowered by a predetermined angle θ toward the frame 110 (z-axis direction).

After the mask strip 120 is bonded to the frame 110, the insertion block 130 is removed from the fastening recess 114. In this manner, the deposition mask 100 is manufactured and set in a deposition apparatus for forming an organic emission layer.

Figure 3A:
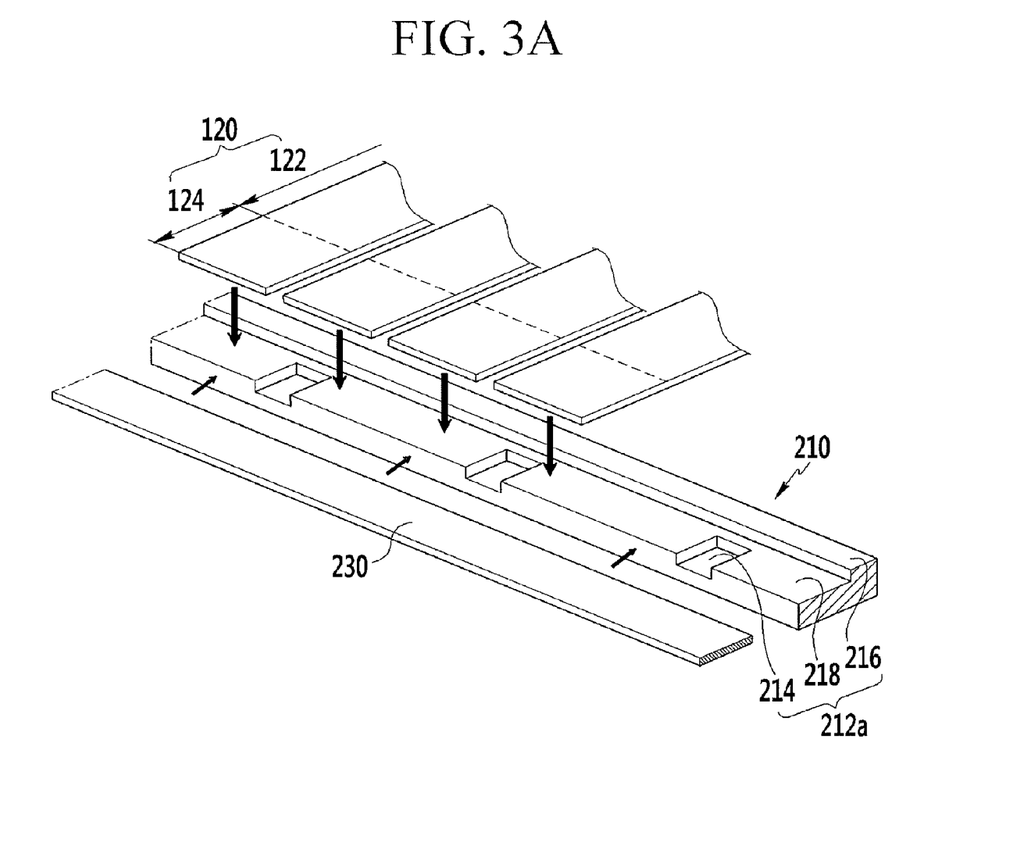
FIGS. 3A to FIG. 3C sequentially illustrate a method of manufacturing a deposition mask according to a second example embodiment.
Figure 3B:
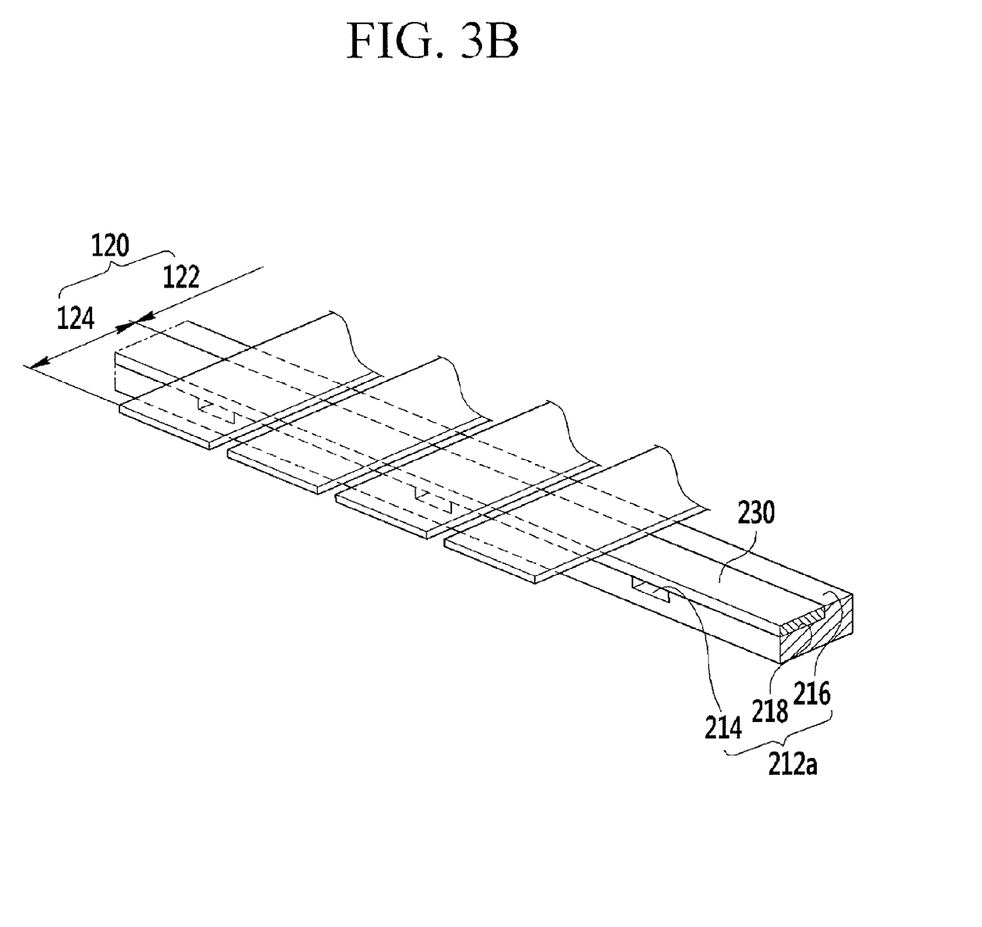
Figure 3C:
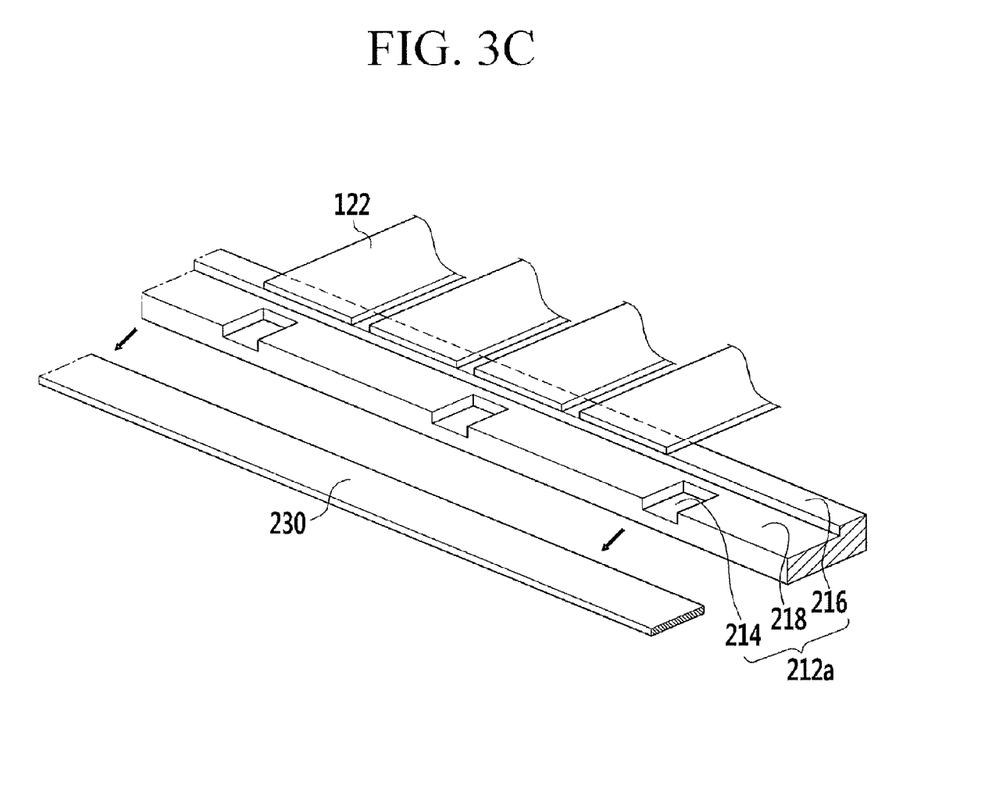

FIGS. 3A to FIG. 3C sequentially illustrate a method of manufacturing a deposition mask according to the second example embodiment.

The method of manufacturing a deposition mask according to the second example embodiment is identical to the method of manufacturing a deposition mask according to the first example embodiment except that the shapes of the frame and insertion block are modified. Description of configurations and processes identical to those of the first example embodiment are omitted and like reference numerals refer to like elements in the first and second example embodiments.

The frame according to the second example embodiment is identical to that of the first example embodiment except with regard to a first support 212a, and thus description is focused on the first support 212a.

Referring to FIG. 3A, the first support 212a includes a contact face 216 corresponding to one face thereof, a stepped face 218 formed outside the contact face 216 having a height lower than the contact face 216, and a fastening recess 214 formed at the outer edge thereof.

When the mask strip 120 is bonded to the frame 110, the mask strip 120 is stretched in a direction in which the mask strip 120 is lowered by a predetermined angle to the frame 210 (z-axis direction), and thus the mask strip 120 may be twisted without being uniformly stretched due to a height difference between the contact face 216 and the stepped face 218.

To help prevent this, an insertion block 230 is disposed on the stepped face 218, as shown in FIG. 3B. The insertion block 230 is a panel member extended along the stepped face 218 and may have a thickness corresponding to the height difference between the contact face 216 and the stepped face 218.

After the mask strip 120 is bonded to the frame 210, the insertion block 230 is removed from the stepped face 218. In this manner, the deposition mask 100 is manufactured and set in the deposition apparatus for forming an organic emission layer.

Figure 4:
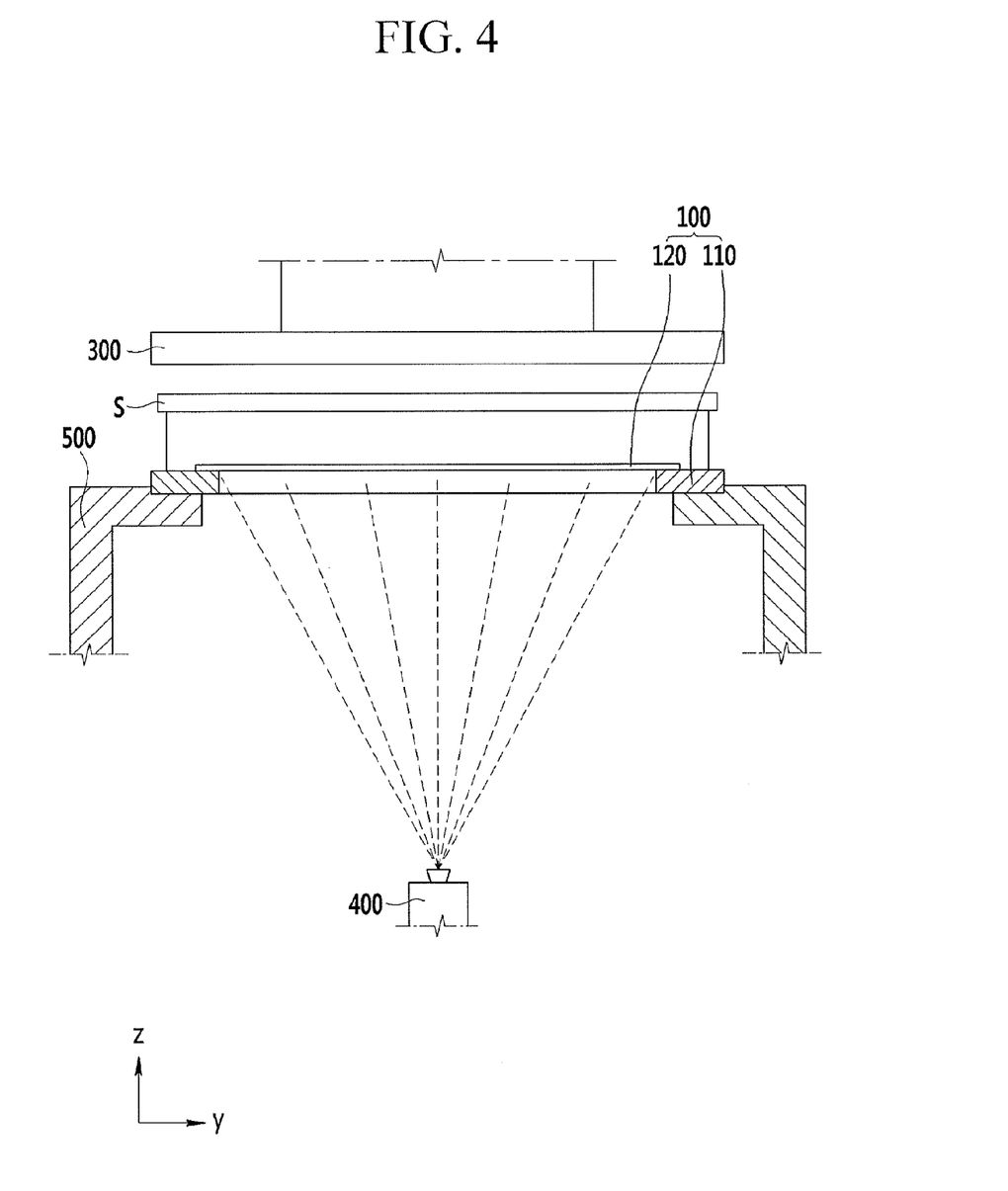
FIG. 4 illustrates a deposition apparatus used to deposit an organic film using a deposition mask manufactured by the methods of manufacturing a deposition mask according to the example embodiments.

FIG. 4 illustrates a deposition apparatus for depositing an organic film using a deposition mask manufactured by the methods of manufacturing a deposition mask according to the example embodiments.

Referring to FIG. 4, to form a thin film of an OLED display, e.g., an RGB organic emission layer using the deposition mask 100, a deposition source 400 is located in a vacuum chamber (not shown) in which an appropriate vacuum is maintained. While the deposition mask 100 is used to form electrodes and an emission layer of the OLED in the present example embodiment, embodiments are not limited thereto and the deposition mask 100 may be applied to formation of electrodes of other flat panel displays.

The vacuum chamber may further include a vacuum pump (not shown) for discharging a gas from the vacuum chamber to reduce the internal pressure of the vacuum chamber and a venting means (not shown) for injecting a predetermined gas into the vacuum chamber to increase the internal pressure of the vacuum chamber.

The deposition source 400 emits a deposition material to deposit the material on a substrate S and includes a space (not shown) capable of storing a deposition material such as an organic material. The deposition source evaporates an organic material to deposit the organic material on the substrate S. The deposition source 400 may be configured as a dot deposition source, a linear deposition source, etc. as necessary.

The substrate S is fixed by a substrate fastening part (not shown) such that the substrate S faces the deposition source 400. The substrate fastening part has a structure in which the substrate S may be easily attach/detached to/from the substrate fastening part because the substrate fastening part needs to stably fix the substrate S during formation of a thin film on the substrate S using a deposition material and to discharge the substrate S to the outside of the vacuum chamber after formation of the thin film. The substrate fastening part has the same configuration as that of a conventional deposition apparatus and, as such, detailed description thereof is omitted.

The deposition mask 100 including the frame 110 and the mask strip 120 is disposed between the substrate S and the deposition source 400. The deposition mask 100 is fixed to a mask fixing part 500. A fastening member (not shown) of the mask fixing part 500 is combined with the fastening recess 114 or 214 of the frame 120 of the deposition mask 100. Then, a magnet unit 300 is driven to bring the deposition mask 100 into contact with the substrate S. Upon alignment of the substrate S and the deposition mask 100 at a desired position, the deposition source 400 is heated to evaporate an organic material stored in the deposition source 400 to deposit the organic material on the substrate S.

By way of summation and review, in a flat panel display such as an OLED display, an organic material or a metal used as an electrode may be deposited through vacuum deposition on a flat substrate in a vacuum using a thin film deposition apparatus to form a thin film on the flat substrate. Vacuum deposition may be performed in such a manner that a substrate on which an organic thin film will be formed is located in a vacuum chamber of the thin film deposition apparatus and an organic material is evaporated or sublimated using a deposition source unit to form the organic thin film on the substrate.

To form an organic film in a desired form on a substrate, a deposition mask may be used. When an organic material is deposited on a large substrate having a predetermined size or more, a metal mask having high durability and strength may be used as the deposition mask for stable deposition of an organic material in a desired pattern. A deposition technology using this metal mask may be used for processes of depositing an organic material and forming a cathode, which are employed to manufacture an OLED display.

A fine metal mask (FMM) may be used to deposit an organic material in a fine pattern on a large substrate. It is may be possible to simultaneously form a plurality of desired fine organic patterns on a predetermined position of a substrate using the FMM. To deposit an organic material in a desired pattern, the FMM may include a plurality of rectangular slots or an opening pattern such as striped slits.

When a plurality of unit mask strips having an opening pattern through which an organic material passes is fixed to a frame, tension may be uniformly applied thereto in a predetermined direction. A fastening recess for fastening the frame to a fixing part of a deposition apparatus may be formed at one side of the frame to which the unit mask strips are bonded. The fastening recess may cause the unit mask strips bonded to the frame to be twisted or deformed.

As described above, embodiments relate to a method of manufacturing a deposition mask, and more particularly, to a method of manufacturing a deposition mask used to bond a unit mask strip to which tension has been applied to a frame.

Embodiments may provide a method of manufacturing a deposition mask having advantages of bonding a unit mask strip to a frame without twisting or deforming the unit mask strip. According to example embodiments, a unit mask frame may be bonded to a frame without being twisted or deformed. Accordingly, a deposition mask may closely come into contact with a substrate during a deposition process to reduce a shadow phenomenon that an organic material is infiltrated between the deposition mask and the substrate. Furthermore, according to example embodiments, a uniform thin film may be formed, and thus accuracy of an organic emission layer pattern may be improved when an OLED display is manufactured, enhancing display quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a deposition mask, the method comprising:

providing a frame including a pair of first supports and a pair of second supports surrounding an opening, each of the first supports including a contact face corresponding to a face of each of the first supports and including a fastening recess at an outer edge of each of the first supports;

inserting an insertion block corresponding in shape to the fastening recess into the fastening recess;

bonding opposing ends of a mask strip having an opening pattern to the contact face of each of the first supports while stretching the mask strip; and removing the insertion block from the fastening recess, wherein removing the insertion block from the fastening recess is performed when the opposing ends of the mask strip are bonded to the contact face of each of the first supports.

2. The method of claim 1, wherein the mask strip includes a strip main body and clamping parts, the strip main body having an opening pattern, the clamping parts extending from opposing ends of the strip main body in an elongation direction of the strip main body, and wherein the bonding of the mask strip includes bonding the opposing ends of the strip main body to the contact face while gripping the clamping parts to stretch the mask strip.

3. The method of claim 2, further comprising removing the clamping parts from the mask strip after bonding the mask strip.

4. The method of claim 1, wherein the insertion block inserted into the fastening recess has a same height as the contact face.

5. The method of claim 1, wherein the first supports include a plurality of fastening recesses, the fastening recesses being disposed at a predetermined interval along the first supports, and the insertion block is inserted into each of the fastening recesses.

6. The method as claimed in claim 1, wherein the inserting, the bonding, and the removing are performed sequentially in the stated order.

7. The method as claimed in claim 1, wherein the fastening recess extends to an outer peripheral side of the each of the first supports.

8. The method as claimed in claim 1, wherein removing the insertion block from the fastening recess exposes the fastening recess such that the exposed fastening recess is used to fix the deposition mask to a deposition apparatus.

9. A method of manufacturing a deposition mask, the method comprising:

providing a frame including a pair of first supports and a pair of second supports surrounding an opening, each of the first supports including a contact face corresponding to a face of the first support, a stepped face outside the contact face and having a height lower than the contact face, and a fastening recess at an outer edge of the first support;

disposing an insertion block extending along the stepped face on the stepped face;

bonding opposing ends of a mask strip having an opening pattern to the contact faces while stretching the mask strip; and removing the insertion block from the stepped face.

10. The method of claim 9, wherein the mask strip includes a strip main body and clamping parts, the strip main body having the opening pattern, the clamping parts extending from opposing ends of the strip main body in an elongation direction of the strip main body, and wherein the bonding of the mask strip includes bonding the opposing ends of the strip main body to the contact face while gripping the clamping parts to stretch the mask strip.

11. The method of claim 10, further comprising removing the clamping parts from the mask strip after bonding the mask strip.

12. The method of claim 9, wherein the insertion block has a thickness corresponding to a height difference between the contact face and the stepped face.

13. The method as claimed in claim 9, wherein the disposing, the bonding, and the removing are performed sequentially in the stated order.

* * * * *